United States Patent
Kinge et al.

(10) Patent No.: US 10,897,023 B2
(45) Date of Patent: Jan. 19, 2021

(54) ALL QUANTUM DOT BASED OPTOELECTRONIC DEVICE

(71) Applicants: TOYOTA MOTOR EUROPE, Brussels (BE); THE GOVERNING COUNCIL OF THE UNIVERSITY OF TORONTO, Toronto (CA)

(72) Inventors: Sachin Kinge, Steenokkerzeel (BE); Zhenyu Yang, Toronto (CA); Oleksandr Voznyy, Thornhill (CA); Sjoerd Hoogland, Toronto (CA); Edward Sargent, Toronto (CA)

(73) Assignees: TOYOTA MOTOR EUROPE, Brussels (BE); THE GOVERNING COUNCIL OF THE UNIVERSITY OF TORONTO, Toronto (CA)

(*) Notice: Subject to any disclaimer, the term of this patent is extended or adjusted under 35 U.S.C. 154(b) by 0 days.

(21) Appl. No.: 15/765,396

(22) PCT Filed: Oct. 2, 2015

(86) PCT No.: PCT/EP2015/072836
§ 371 (c)(1),
(2) Date: Apr. 2, 2018

(87) PCT Pub. No.: WO2017/054887
PCT Pub. Date: Apr. 6, 2017

(65) Prior Publication Data
US 2018/0254421 A1 Sep. 6, 2018

(51) Int. Cl.
*H01L 51/50* (2006.01)
*H01L 51/00* (2006.01)
(Continued)

(52) U.S. Cl.
CPC .......... *H01L 51/502* (2013.01); *H01L 51/005* (2013.01); *H01L 51/426* (2013.01);
(Continued)

(58) Field of Classification Search
CPC ... H01L 51/50; H01L 51/5012; H01L 51/502; H01L 51/5056; H01L 51/5072
See application file for complete search history.

(56) References Cited

U.S. PATENT DOCUMENTS

2010/0059721 A1* 3/2010 Pickett .................. B82Y 30/00
252/519.3
2014/0014896 A1 1/2014 Chung et al.
(Continued)

FOREIGN PATENT DOCUMENTS

WO 2012/138410 A1 10/2012
WO 2012/161179 A1 11/2012
(Continued)

OTHER PUBLICATIONS

Hines et al, "Colloidal PbS Nanocrystals with Size-Tunable Near-Infrared Emission: Observation of Post-Synthesis Self-Narrowing of the Particle Size Distribution", Nov. 2003, Advanced Materials, 15, No. 21; pp. 1844-1849 (Year: 2003).*
(Continued)

*Primary Examiner* — David C Spalla
(74) *Attorney, Agent, or Firm* — Oliff PLC (57) ABSTRACT

An optoelectronic device has an electron transport layer, an active layer, and a hole transport layer. Each of the electron transport layer, the active layer, and the hole transport layer has quantum dots.

20 Claims, 4 Drawing Sheets

(51) Int. Cl.
*H01L 51/56* (2006.01)
*H01L 51/42* (2006.01)

(52) U.S. Cl.
CPC ...... *H01L 51/5056* (2013.01); *H01L 51/5072* (2013.01); *H01L 51/56* (2013.01); *Y02E 10/549* (2013.01)

(56) References Cited

U.S. PATENT DOCUMENTS

| | | | |
|---|---|---|---|
| 2014/0145145 A1 | 5/2014 | Lee et al. | |
| 2016/0155970 A1* | 6/2016 | Chung | H01L 51/502 257/40 |
| 2016/0237344 A1* | 8/2016 | Bakr | H01L 21/02628 |
| 2016/0238455 A1* | 8/2016 | Congreve | G01J 9/00 |
| 2017/0155051 A1* | 6/2017 | Torres Cano | C09K 11/02 |
| 2018/0151817 A1* | 5/2018 | Cho | H05B 33/14 |
| 2019/0211259 A1* | 7/2019 | Khalil | C09K 11/025 |

FOREIGN PATENT DOCUMENTS

| | | | |
|---|---|---|---|
| WO | WO-2012161179 A1 * | 11/2012 | B82Y 20/00 |
| WO | 2014/208896 A1 | 12/2014 | |

OTHER PUBLICATIONS

Hines et al, "Colloidal PbS Nanocrystals with Size-Tunable Near-Infrared Emission: Observation of Post-Synthesis Self-Narrowing of the Particle Size Distribution", Nov. 2003, Advanced Materials, 15, No. 21; pp. 1844-1849 (Year: 2003) (Year: 2003).*

Hines et al, "Colloidal PbS Nanocrystals with Size-Tunable Near-Infrared Emission: Observation of Post-Synthesis Self-Narrowing of the Particle Size Distribution", Nov. 2003, Advanced Materials, 15, No. 21; pp. 1844-1849 (Year: 2003) (Year: 2003) (Year: 2003).*

Patrick R. Brown et al., "Energy Level Modification in Lead Sulfide Quantum Dot Thin Films through Ligand Exchange", ACS NANO, vol. 8, No. 6, pp. 5863-5872, 2014.

Liangfeng Sun et al. "Bright infrared quantum-dot light-emitting diodes through inter-dot spacing control", Nature Nanotechnology, vol. 7, No. 6, pp. 369-373, 2012.

Wenjia Hu et al., "Near-infrared quantum dot light emitting diodes employing electron transport nanocrystals in a layered architecture", Nanotechnology, vol. 23, No. 37, 6 pages, 2012.

Hines M et al. "Colloidal PbS Nanocrystals with Size-Tunable Near-Infrared Emission: Observation of Post-Synthesis Self-Narrowing of the Particle Size Distribution" Advanced Materials, vol. 15, No. 21, pp. 1844-1849, 2003.

Jun. 1, 2016 International Search Report issued in International Patent Application No. PCT/EP2015/072836.

Jun. 1, 2016 Written Opinion issued in International Patent Application No. PCT/EP2015/072836.

Long Hu et al., "PbS colloidal quantum dots as an effective hole transporter for planar heterojunction perovskite solar cells", Journal of Materials Chemistry A, pp. 515-518, 2015.

* cited by examiner

ALL QUANTUM DOT BASED OPTOELECTRONIC DEVICE

FIELD OF THE DISCLOSURE

The present disclosure is related to optoelectronic devices, and more particularly to infrared optoelectronic devices.

BACKGROUND OF THE DISCLOSURE

Optoelectronic devices, also referred to as electroluminescent devices, include diodes, such as light emitting diodes (LEDs) or photodiodes. Such LEDs and photodiodes, in particular infrared LEDs (IR-LEDs) and infrared (IR)—photodiodes, are used in the communication and sensing technology. For example, IR LEDs may be integrated into automobile components for 3D gesture recognition, or communication applications.

Both LEDs and photodiodes are semiconductor diodes having substantially a similar structure. Therefore in the following, when it is referred to an "LED", this also shall include photodiodes. An LED comprises essentially three layers, i.e. an electron transport layer (ETL) and hole transport layer (HTL), between which an active layer (AL) is sandwiched. The ETL and HTL are also referred to as charge transmission layers (CTL). The active layer is a light emitting layer.

An important aspect of optoelectronic devices is their efficiency, e.g. the efficiency of a LED to convert electricity to light or of a photodiode to convert light into electricity. The efficiency of a LED can be indicated by its External Quantum Efficiency (EQE). The EQE of a LED is the ratio of the number of photons emitted from the LED to the number of electrons passing through the device. There have been different approaches in the prior art to ameliorate the efficiency of optoelectronic devices.

In particular, colloidal quantum dots (CQDs) are one of the most promising candidates for creating a new generation of optoelectronic devices, in particular LEDs. So far, most of CQD based LEDs comprise a CQD emission (i.e. active) layer sandwiched between two carrier transport layers (i.e. an electron transport layer ETL and a hole transport layer HTL) using different organic or inorganic materials. The choices of materials for assembling hole- and electron transport layers are conjugated small molecules and polymers, and in particular inorganic materials. Inorganic materials such as metal-oxide and nitride thin films may be integrated into LEDs as the charge transmission layers (CTLs) to improve device stability and charge injection. However, the performance of the abovementioned all-inorganic devices has been seriously degraded thus far by quenching of the active CQD by the metal oxide layer, and by imbalanced charge injection from the two types of CTLs. Moreover, fabrication often requires complex infrastructure and high-temperature processing, reducing the manufacturability benefit of CQD processing.

Recently, small-diameter metal oxide and quantum dot nanoparticles were incorporated into CQD solids and employed as CTL materials. Benefits such as tunability of the CTLs' bandgaps and high charge carrier mobilities were demonstrated by integrating a CQD-based HTL with planar perovskite photovoltaics (cf. Hu, L.; Wang, W.; Liu, H.; Peng, J.; Cao, H.; Shao, G.; Xia, Z.; Ma, W.; Tang, J., PbS colloidal quantum dots as an effective hole transporter for planar heterojunction perovskite solar cells. Journal of Materials Chemistry A 2015, 3 515).

SUMMARY OF THE DISCLOSURE

Currently, it remains desirable to provide an optoelectronic device with an enhanced efficiency. For example, the inventors of the present application have recognized that it is desirable to provide an optoelectronic device, whose characteristics can be adapted such that the efficiency of the emissive light (in case of e.g. a LED) in the spectrum of interest, e.g. in an IR spectrum, is optimized.

Therefore, according to embodiments of the present disclosure, an optoelectronic device is provided comprising an electron transport layer, an active layer, and a hole transport layer. Each of the electron transport layer, the active layer, and the hole transport layer comprises quantum dots.

Accordingly, the electron transport layer, the active layer, and the hole transport layer may be obtained by quantum dots, in particular by providing for each of the electron transport layer, the active layer, and the hole transport layer at least one layer of quantum dots.

In other words, each of the electron transport layer, the active layer, and the hole transport layer is based on quantum dots or may consist of quantum dots.

Therefore a quantum dot: quantum dot heterojunction may be provided between the electron transport layer and the active layer, and also between the hole transport layer and the active layer.

By providing such a configuration it is possible that the characteristics of each of the electron transport layer, the active layer, and the hole transport layer may be freely adapted, in order to match with the requirements to the optoelectronic device. This may be done by selecting for each of the electron transport layer, the active layer, and the hole transport layer quantum dots, which have respectively suitable characteristics.

For example, it is possible to define the characteristics of the electron transport layer, the active layer, and the hole transport layer such that the light emission efficiency and/or the External Quantum Efficiency (EQE) of the optoelectronic device is optimized.

According to a further aspect of the disclosure the quantum dots of the electron transport layer are preferably configured to transport electrons. The quantum dots of the hole transport layer are preferably configured to transport holes.

By providing such a configuration quantum dots may be arranged on two opposite sides of the active layer and may serve on one side as an electron transport layer and on the other side as a hole transport layer.

Optionally, the quantum dots of the electron transport layer, the active layer, and the hole transport layer are colloidal quantum dots.

The quantum dots of the electron transport layer, the active layer, and the hole transport layer may comprise the same material. Preferably this material is lead (II) sulfide (PbS).

Said material PbS is suitable to provide an optoelectronic device which is configured to emit light (such as an IR-LED) in an infrared spectrum. However, also other materials or combinations of materials may be used. For example the quantum dots may comprise materials from II-IV, III-V, II-VI or IV-VI type.

By using the same material for all quantum dots of the device the chemical compatibility between the layers may be enhanced (i.e. any reactivity avoided). Moreover fabrication of the device can be simplified, i.e. made more cost efficient, as e.g. all quantum dots may be fabricated in a similar process with different growing times of the quantum dots of the different layers.

The quantum dots of the electron transport layer, the active layer, and the hole transport layer preferably differ in size.

The size of the quantum dots of the active layer may be larger than that of the electron transport layer and of the hole transport layer. Accordingly, by providing relatively small quantum dots for the electron transport layer and the hole transport layer, these layers may effectively block and inject the respective charge carriers.

The size of the quantum dots of the electron transport layer may be larger than that of the hole transport layer.

The size of the quantum dots of at least one the electron transport layer, the active layer, and the hole transport layer may be configured such that said quantum dots have a light absorption and/or emission spectrum with a predetermined maximum.

Hence, it is possible to define the light absorption maximum and/or light emission maximum of the quantum dots by adapting their size. Accordingly, when fabricating the optoelectronic device, such as a LED, the sizes of the quantum dots of the electron transport layer, the active layer, and the hole transport layer are preferably chosen such that the optoelectronic device has a required light emission and/or light absorption characteristic.

For example, it is possible to define the maxima of the light absorption and/or emission spectra of the quantum dots of the electron transport layer and the hole transport layer such that these maxima are different from the maximum of the light absorption and/or emission spectrum of the quantum dots of the active layer. Consequently, the light absorption and/or emission spectra of the quantum dots of the electron transport layer and the hole transport layer disturb as few as possible the light absorption and/or emission spectrum of the quantum dots of the active layer.

As an example, the quantum dots of the electron transport layer may have a size of approximately 2.5 nm. As another example, the quantum dots of the active layer may have a size of approximately 4 to 6 nm. As still another example, the quantum dots of the hole transport layer may have a size of approximately 2.0 nm. Said sizes are preferably the average diameters of the quantum dots.

The electron transport layer may comprise two layers of quantum dots or more.

Further, the active layer may comprise two layers of quantum dots or more.

Further, the hole transport layer may comprise four layers of quantum dots or more.

By providing such a configuration a thin and efficient optoelectronic device, such as a LED, can be obtained. By this configuration the balance of charge injection can be optimized.

The quantum dots of at least one of the electron transport layer, the active layer, and the hole transport layer preferably comprise surface attached ligands.

The ligands of the quantum dots of the active layer are preferably configured to separate the quantum dots of the active layer and to enable charge injection.

The quantum dots of at least one of the electron transport layer and the hole transport layer may be doped by the surface attached ligands.

Accordingly, the extraction of hole and electron may be done using band gap tuned quantum dots. The quantum dots of the electron transport layer and the hole transport layer may be prepared by same material as the quantum dots of the active material. However, they are preferably doped with ligands, to provide them with hole and electron absorbing properties.

Preferably the surface attached ligands of the quantum dots of the electron transport layer are configured to extract holes from the quantum dots of the electron transport layer. Further the surface attached ligands of the quantum dots of the hole transport layer are preferably configured to extract electrons from the quantum dots of the hole transport layer.

Furthermore the surface attached ligands of the quantum dots of the electron transport layer may comprise inorganic cations and/or the surface attached ligands of the hole transport layer may comprise thiols.

The surface attached ligands of the quantum dots of the hole transport layer may comprise mercaptopropionic acid (MPA), in particular preferably with a molecular weight of 106.14 g/mol.

The surface attached ligands of the quantum dots of the active layer may comprise mercaptooctanoic acid (MOA) and/or longer ligands. The MOA ligands have preferably a molecular weight of 176.82 g/mol. Also other carboxylic-acid-terminated thiol ligands might be used instead or in addition.

Moreover the surface attached ligands of the quantum dots of the electron transport layer may comprise tetrabutylammonium iodide (TBAI), in particular preferably with a molecular weight of 369.37 g/mol.

The invention also refers to a method for fabricating an optoelectronic device. In the method it is provided a hole transport layer, an active layer, and an electron transport layer. Each of the steps of providing the hole transport layer, the active layer, and the electron transport layer comprises providing at least one layer of quantum dots.

Accordingly, each of the hole transport layer, the active layer, and the electron transport layer is provided by providing one or more layers of quantum dots. Of course, the order of the provision of the layers may be different. For example, it is possible that first a hole transport layer, then an active layer, and then an electron transport layer is provided. However, it is also possible that first an electron transport layer, then an active layer, and then a hole transport layer is provided.

Before the steps of providing the hole transport layer, the active layer, and the electron transport layer, the method preferably further comprises the steps of providing a predetermined material, in particular lead (II) sulfide (PbS), and preparing the quantum dots of the electron transport layer, the active layer, and the hole transport layer of said material.

Hence, it is possible that the same material is used to prepare, i.e. produce, the quantum dots of each of the hole transport layer, the active layer and the electron transport layer. Of course, also a combination of materials may be used to prepare, i.e. produce, the quantum dots of each of the hole transport layer, the active layer and the electron transport layer. Moreover, by such a method it is possible that the quantum dots of each of the hole transport layer, the active layer and the electron transport layer are manufactured by the same procedure, wherein preferably only the growing time of the quantum dots of the hole transport layer, the active layer and the electron transport layer differs.

The quantum dots of the electron transport layer, the active layer, and the hole transport layer may be prepared by wet chemical synthetic methods or physical or chemical vapor deposition methods.

The size of the quantum dots of the electron transport layer, the active layer, and the hole transport layer may be controlled by the growing time of the quantum dots. For example the growing time of quantum dots of the electron transport layer may be 5 minutes. As another example the growing time of quantum dots of the active layer may be 20 minutes. As still another example the growing time of quantum dots of the hole transport layer may be 3 minutes.

In this way, the same procedure may be employed, in order to prepare all quantum dots of the electron transport layer, the active layer, and the hole transport layer. The required different sizes of the quantum dots may be easily controlled by adapting the growth time of the quantum dots during the procedure.

The quantum dots of the hole transport layer and/or the electron transport layer may be synthesized using a hot injection method. However, such a procedure may also be applied to prepare the quantum dots of the active layer.

Moreover, the quantum dots of the active layer may be synthesized using lead (II) oleate as precursor. However, such a procedure may also be applied to prepare the quantum dots of the electron transport layer and/or the hole transport layer.

It is intended that combinations of the above-described elements and those within the specification may be made, except where otherwise contradictory.

It is to be understood that both the foregoing general description and the following detailed description are exemplary and explanatory only and are not restrictive of the disclosure, as claimed.

The accompanying drawings, which are incorporated in and constitute a part of this specification, illustrate embodiments of the disclosure and together with the description, serve to explain the principles thereof.

DESCRIPTION OF THE EMBODIMENTS

Reference will now be made in detail to exemplary embodiments of the disclosure, examples of which are illustrated in the accompanying drawings. Wherever possible, the same reference numbers will be used throughout the drawings to refer to the same or like parts.

Figure 1A:
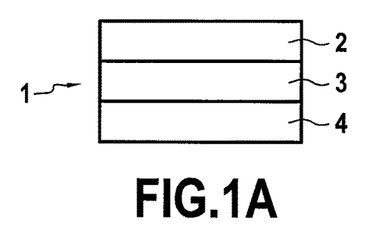
FIG. 1A shows a schematic representation of an exemplary optoelectronic device according to an embodiment of the present disclosure.

FIG. 1A shows a schematic representation of an exemplary LED (optoelectronic device) 1 according to the present disclosure. The LED comprises an electron transport layer (ETL) 2, an active layer 3 and a hole transport layer (HTL) 4. The active layer is arranged between the electron transport layer (ETL) 2 and the hole transport layer (HTL) 4. The electron transport layer (ETL) 2 and the hole transport layer (HTL) 4 comprise quantum dots, preferably they consist of quantum dots. Also the active layer 3 preferably comprises quantum dots, more preferably it consists of quantum dots.

Figure 1B:
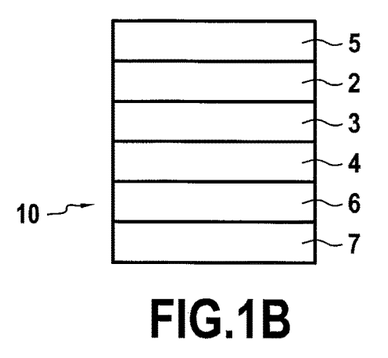
FIG. 1B shows the exemplary optoelectronic device of FIG. 1 with electrodes and a substrate.

FIG. 1B shows the exemplary LED (optoelectronic device) 1 of FIG. 1A with first and second electrodes 5, 6 and a substrate 7. This combination is referenced with "10". The first electrode 5 may be operated as the cathode. The second electrode 6 may be operated as the anode. Furthermore the first and/or second electrode may comprise an indium tin oxide (ITO) layer and/or a silver (Ag) layer. The substrate 7 may be a glass substrate. The second electrode 6 may be coated on the substrate 7.

Figure 2A:
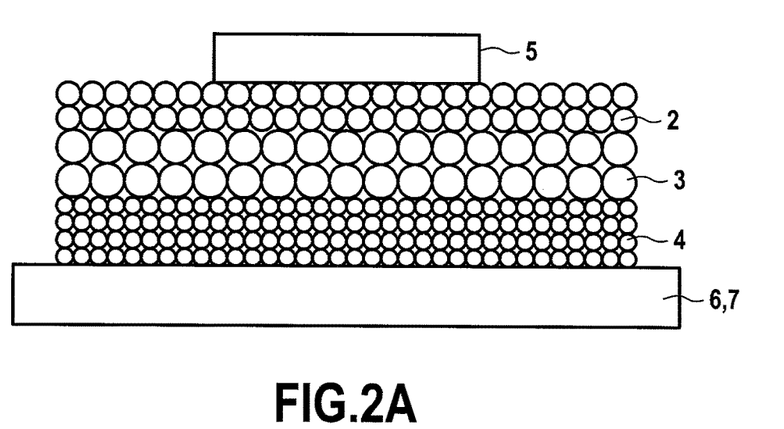
FIG. 2A shows the exemplary optoelectronic device of FIGS. 1A and 1B, wherein the quantum dots are schematically illustrated.

FIG. 2A shows the exemplary LED (optoelectronic device) of FIGS. 1A and 1B, wherein the quantum dots are schematically illustrated. The quantum dots of the active layer 3 are larger than those of the electron transport layer 2 and the hole transport layer 4. Moreover the quantum dots of the electron transport layer 2 are larger than those of the hole transport layer 4. The electron transport layer 2 preferably comprises 2 layers of quantum dots. Also the active layer 3 preferably comprises 2 layers of quantum dots. The hole transport layer 4 preferably comprises 4 layers of quantum dots.

Figure 2B:
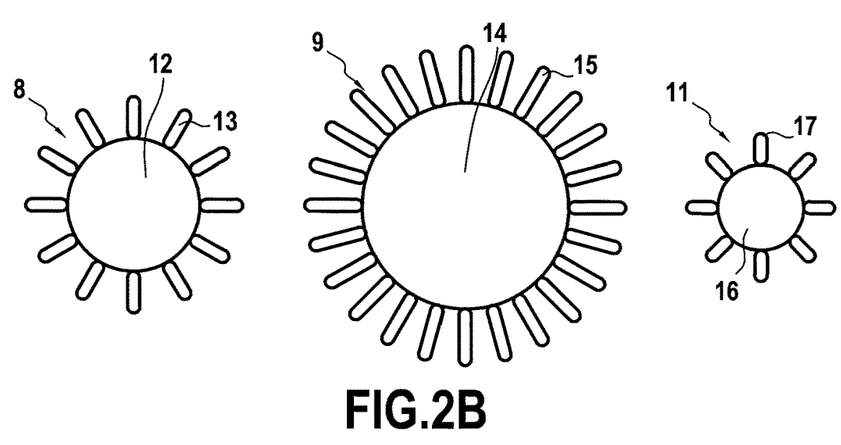
FIG. 2B shows schematic representations of the quantum dots and the surface attached ligands.

FIG. 2B shows schematic representations of the quantum dots and the surface attached ligands. The quantum dot 14 represents a quantum dot of the active layer. The quantum dot 14 is at least partially covered by ligands 15, which are attached to its surface. This combination referenced with "9" of the quantum dot 14 and the surface attached ligands 15 is used in the active layer 3 of the LED shown in FIG. 2A. The ligands 15 may comprise, or preferably consist of mercaptooctanoic acid (MOA), preferably with a molecular weight of 176.82 g/mol.

Moreover the quantum dot 12 represents a quantum dot of the electron transport layer. The quantum dot 12 is at least partially covered by ligands 13, which are attached to its surface. This combination referenced with "8" of the quantum dot 12 and the surface attached ligands 13 is used in the electron transport layer 2 of the LED shown in FIG. 2A. The ligands 13 may comprise, or preferably consist of tetrabutylammonium iodide (TBAI), preferably with a molecular weight of 369.37 g/mol.

Furthermore the quantum dot 16 represents a quantum dot of the hole transport layer. The quantum dot 16 is at least partially covered by ligands 17, which are attached to its surface. This combination referenced with "11" of the quantum dot 16 and the surface attached ligands 17 is used in the hole transport layer 4 of the LED shown in FIG. 2A. The ligands 17 may comprise, or preferably consist of mercaptopropionic acid (MPA), preferably with a molecular weight of 106.14 g/mol.

The quantum dots 12, 14 and 16 have preferably a substantially spherical form.

The quantum dots of the electron transport layer may have a size of approximately 2.5 nm. The quantum dots of the active layer may have a size of approximately 4 to 6 nm. The quantum dots of the hole transport layer may have a size of approximately 2.0 nm. Said sizes are preferably the average diameters of the quantum dots The materials, on which the quantum dots 12, 14 and 16 are based on, is preferably the same. The quantum dots 12, 14 and 16 may also be prepared by the same procedure. The quantum dots 12, 14 and 16 are preferably colloidal quantum dots. The quantum dots 14, 16 and 17 are defined as any semiconductor particle with a band gap of 0.2-4.0 eV. The quantum dots are made of materials from II-IV, III-V, II-VI or IV-VI type. More preferably the quantum dots 14, 16 and 17 comprise lead (II) sulfide (PbS). This material is in particular suitable, if the LED is configured as a IR-LED. The quantum dots 14, 16 and 17 may be prepared by wet chemical, synthetic methods or physical, chemical vapor deposition methods.

The extraction of holes of the quantum dots in the electron transport layer and electrons of the quantum dots in the hole transport layer is done using band gap tuned quantum dots of the same material doped with ligands 13, 17, such as thiols, e.g. MPA, for the HTL and inorganic cations for the ETL, to render them hole and electron absorbing properties.

The spectrum of the LED may be adapted, e.g. within near-infrared area, by changing the size of the quantum dots 14 of the active layer.

Figure 3:
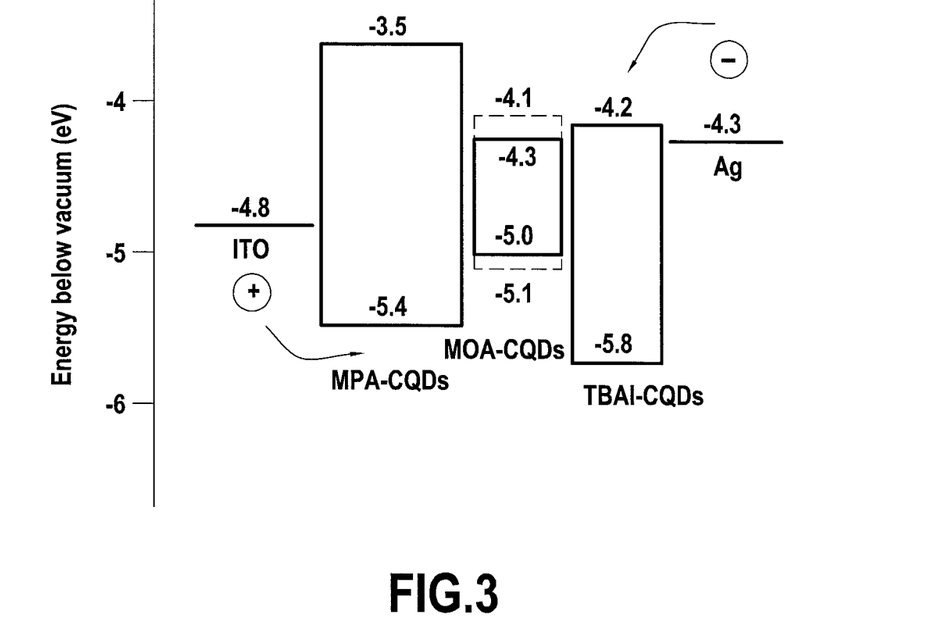
FIG. 3 shows an energy level diagram of an optoelectronic device according to the invention.

FIG. 3 shows an energy level diagram of an optoelectronic device according to the invention. In particular, it shows the energy level below vacuum in eV of the single layers of the LED. The first electrode 1, which is used as a anode, has preferably a level of −4.8 eV. The hole transport layer has preferably an energy level ranging from −5.4 eV to −3.5 eV. The active layer 3 has preferably an energy level ranging from −5.0 eV to −4.3 eV. Alternatively, the active layer may have an energy level ranging from −5.1 eV to −4.1 eV, which is the bandgap regime that is available for this specific architecture of the LED. The electron transport layer has preferably an energy level ranging from −5.8 eV to −4.2 eV. The second electrode 6, which is used as a cathode, has preferably a level of −4.3 eV.

Figure 4:
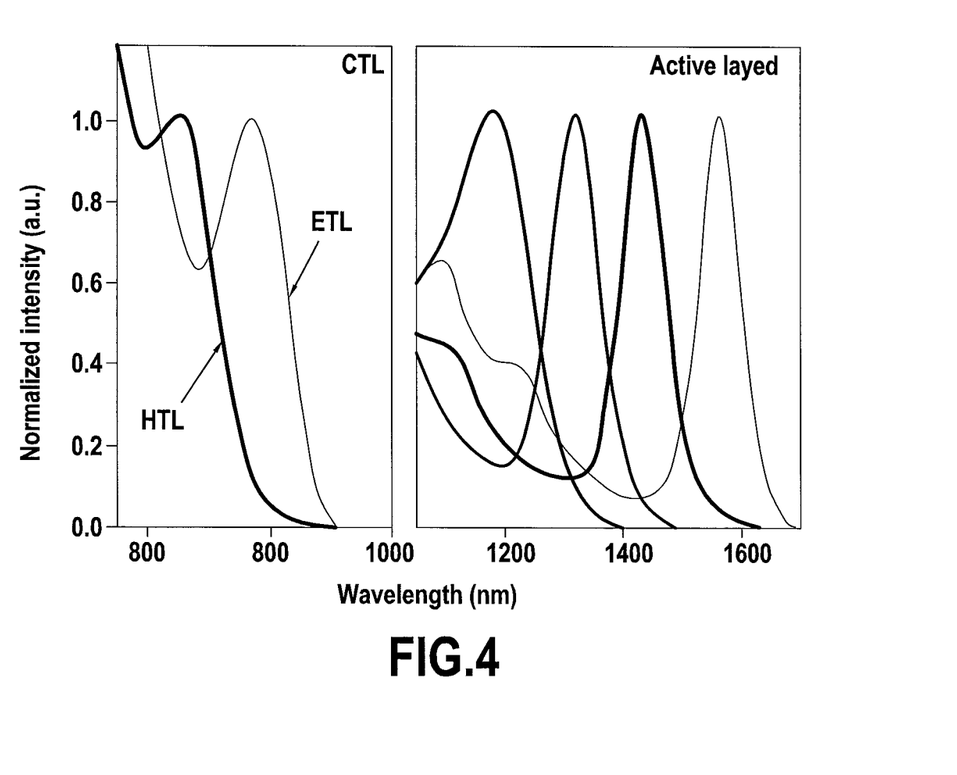
FIG. 4 shows the absorption spectra of quantum dots used for the electron transport layer, the hole transport layer and the active layer of optoelectronic devices according to the invention.

FIG. 4 shows the absorption spectra of quantum dots used for the electron transport layer, the hole transport layer and the active layer of different LEDs (optoelectronic devices) according to the invention. The maxima may be adapted, preferably by adapting the size of the quantum dots, in order to match with the requirements to the LEDs.

As shown in FIG. 4, for each LED the absorption spectra of the quantum dots of the electron transport layer and the hole transport layer are preferably the same. The relatively small quantum dots of the electron transport layer and the hole transport layer have each an absorption maximum at <1000 nm, more preferably at <800 nm and even more preferably at ≤785 nm. In particular, the quantum dots of the electron transport layer may have the absorption maximum in the range of 700-800 nm, preferably in the range of 750-800 nm, and even more preferably at 785 nm. The quantum dots of the hole transport layer may have the absorption maximum in the range of 600-700 nm, preferably in the range of 630-670 nm, and even more preferably at 650 nm.

As further shown in FIG. 4, the absorption spectra of the quantum dots of the active layers of the LEDs may differ from each other, depending on the size of the used quantum dots in the active layers. Alternatively, quantum dots with different sizes (and hence different absorption maxima) may also be used in the same active layer. The relatively large quantum dots of the active layer have an absorption maximum at >1000 nm, more preferably at >1100 nm and even more preferably at >1200 nm. In particular, the quantum dots of the active layer may have the absorption maximum in the range of 1100-1700 nm, preferably in at least one of the ranges of 1200-1240 nm, 1330-1370 nm, 1420-1460 nm, and 1600-1640 nm, and even more preferably at at least one of 1220 nm, 1350 nm, 1440 nm, and 1622 nm.

Consequently, the light absorption and/or emission spectra of the quantum dots of the electron transport layer and the hole transport layer disturb as few as possible the light emission spectrum of the quantum dots of the active layer. Hence, the efficiency of the LEDs can be enhanced.

In the following a method of fabricating a LED according to the invention is described.

First the quantum dots of the electron transport layer, the active layer and the hole transport layer are prepared, i.e. produced. The relatively small quantum dots of the electron transport layer and the hole transport layer, (absorption maximum ≤785 nm) may be synthesized using hot injection method. The relatively large quantum dots of the active layer (absorption maximum >1100 nm) may be synthesized using lead (II) oleate as precursor. Sizes of quantum dots are preferably controlled by the growth time. After synthesis, 1 mL of $CdCl_2$ (0.06 M) oleylamine solution may be injected into the quantum dot reaction flask during the slow cooling process.

Subsequently, the quantum dots of the electron transport layer, the active layer and the hole transport layer are prepared. At a temperature below 40 degree Celsius (DC) the quantum dots of the electron transport layer, the active layer and the hole transport layer may be precipitated by the addition of ~50 mL of acetone and separated by ultracentrifugation. The supernatant is preferably decanted and the quantum dots are redispersed in 2 mL of toluene and transferred into a glovebox. Inside the glovebox, the quantum dots may be re-precipitated, preferably by the addition of an ethanol/methanol mixture (1:1 volume ratio). After the centrifugation, the supernatant may be decanted and quantum dots may be dried in vacuum for 1 hour and then redispersed in octane at a concentration of 50 mg $mL^{-1}$.

Subsequently, a pre-patterned substrate may be provided by an indium tin oxide (ITO)-coated glass. The substrate is preferably treated by oxygen plasma for 10 minutes immediately prior to use.

Subsequently, each functional layer, including the electron transport layer, the active layer and the whole transport layer, is prepared on the substrate, preferably by using layer-by-layer spin-coating deposition of the quantum dots. This is preferably done by deposition of octane solutions with the respective quantum dots of the electron transport layer, the active layer and the whole transport layer under air atmosphere, preferably, at 2500 rpm to obtain each layer. Each layer may have a thickness of substantially 30 nm.

The HTL consists of preferably four layers of relatively small quantum dots (absorption maximum at 650 nm), which are preferably Cadmium chloride ($CdCl_2$)-treated. The quantum dots are preferably spun on the substrate and treated with 1% v/v mercaptopropionic acid (MPA): methanol solution. Each layer may be rinsed with pure methanol for twice. Then the film may be annealed at 50 DC under atmosphere for two hours.

After cooling to room temperature preferably two layers of relatively large quantum dots forming the active layer (absorption maximum >1200 nm) are spun on with the ligand exchange treatment using 1% v/v mercaptooctanoic acid (MOA): acetonitrile solution. The quantum dots of the active layer may be spun after 30 seconds at 1000 rpm. Three rinses with pure acetonitrile may be applied for each layer.

On top of the active layer, preferably two layers of relatively small quantum dots (absorption maximum at 785 nm, without CdCl$_2$ treatment) are spin-casted. Each layer may be treated with 5 mg/ml, of tetrabutylammonium iodide (TBAI): acetonitrile solution and may be spun after 10 seconds at the same speed for 10 seconds. Four rinses with pure acetonitrile may be applied for each layer.

Subsequently, a top electrode, e.g. 220 nm of Ag, may be deposited by thermal evaporation, preferably at a pressure of <1×10$^{-6}$ Torr (~133.3×10$^{-6}$ Pa). Each substrate may be patterned to yield eight devices, each preferably with an area of 4.9 mm$^2$.

For testing the fabricated LED or LEDs (when the substrate and electrodes have been patterned respectively), they may be connected with a source meter. Under a range of forward bias voltages, the emissive light spectra can be collected through a set of lenses focused on an optical fiber and connected to a near infrared (NIR) spectrophotometer.

Figure 5:
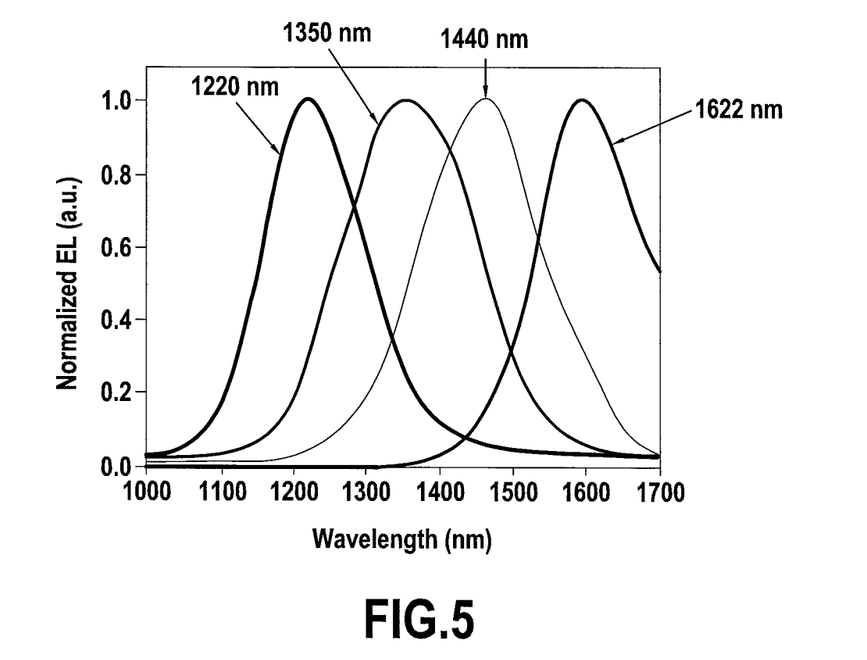
FIG. 5 shows the normalized emissive light spectra of optoelectronic devices according to the invention.

FIG. 5 shows the normalized emissive light spectra of LEDs (optoelectronic devices) according to the invention. Such LEDs may be fabricated with the method described above. As it is shown, the light spectra of the LEDs may have their emissive light maxima in different ranges. The maxima may be adapted, preferably by adapting the size of the quantum dots, in order to match with the requirements to the LEDs. For example, the emissive light maximum efficiency of such a LED may correspond to one of the ranges or values, as described above with regard to the absorption maxima of the LEDs in context of FIG. 4.

Figure 6:
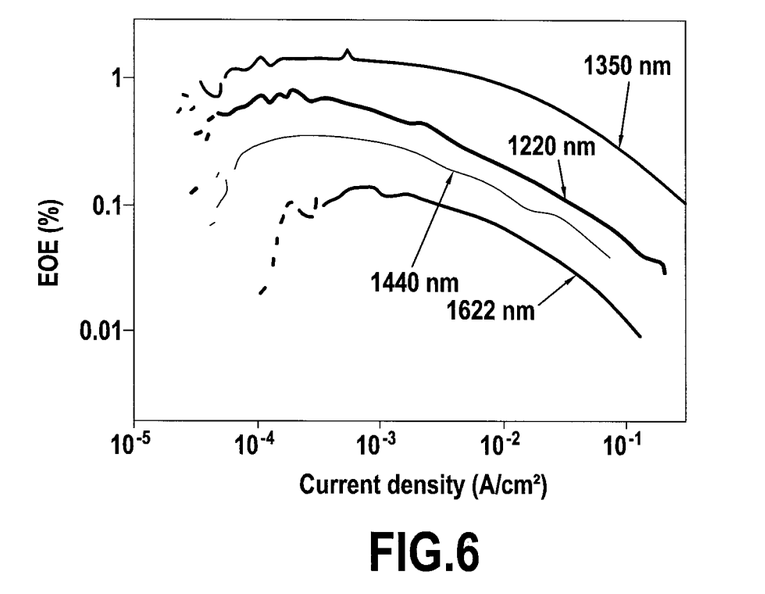
FIG. 6 shows the EQE-current density performance of optoelectronic devices according to the invention emitting at various wavelengths.

FIG. 6 shows the EQE-current density performance of LEDs (optoelectronic devices) according to the invention emitting at various wavelengths. As it is shown, a LED with an emissive light maximum at 1350 nm reaches the best EQE (external quantum efficiency), preferably with up to 1.58%. The second best EQE value is obtained by a LED with an emissive light maximum at 1220 nm, then by a LED with an emissive light maximum at 1440 nm, and then by a LED with an emissive light maximum at 1622 nm.

Figure 7:
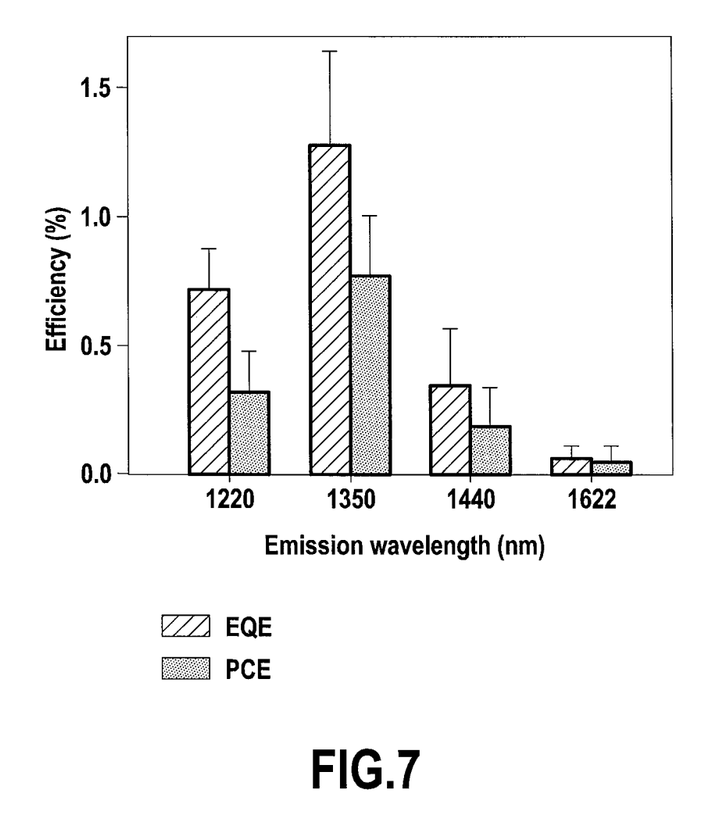
FIG. 7 shows the EQE and PCE values (with error bars) of optoelectronic devices according to the invention emitting at various wavelengths.

FIG. 7 shows the EQE and PCE values (with error bars) of optoelectronic devices according to the invention emitting at various wavelengths. The different wavelengths are like above 1220, 1350 nm, 1440 nm, and 1622 nm. The figure demonstrates the performance details of LEDs, which have been discussed in context of e.g. FIGS. 4, 5 and 6. It shows the average EQE and PCE (Photo Conversion Efficiency) values with error bars of the LEDs.

Throughout the disclosure, including the claims, the term "comprising a" should be understood as being synonymous with "comprising at least one" unless otherwise stated. In addition, any range set forth in the description, including the claims should be understood as including its end value(s) unless otherwise stated. Specific values for described elements should be understood to be within accepted manufacturing or industry tolerances known to one of skill in the art, and any use of the terms "substantially" and/or "approximately" and/or "generally" should be understood to mean falling within such accepted tolerances.

Where any standards of national, international, or other standards body are referenced (e.g., ISO, etc.), such references are intended to refer to the standard as defined by the national or international standards body as of the priority date of the present specification. Any subsequent substantive changes to such standards are not intended to modify the scope and/or definitions of the present disclosure and/or claims.

Although the present disclosure herein has been described with reference to particular embodiments, it is to be understood that these embodiments are merely illustrative of the principles and applications of the present disclosure.

It is intended that the specification and examples be considered as exemplary only, with a true scope of the disclosure being indicated by the following claims.

The invention claimed is:

1. An optoelectronic device comprising:
   an electron transport layer,
   an active layer, and
   a hole transport layer, wherein
   each of the electron transport layer, the active layer, and the hole transport layer comprises quantum dots,
   the quantum dots of at least one of the electron transport layer, the active layer, and the hole transport layer comprise surface attached ligands,
   the quantum dots of at least one of the electron transport layer and the hole transport layer are doped by the surface attached ligands, and
   when the quantum dots of the active layer comprise surface attached ligands, the ligands are configured to separate the quantum dots of the active layer.

2. The optoelectronic device according to claim 1, wherein
   the quantum dots of the electron transport layer are configured to transport electrons and/or the quantum dots of the hole transport layer are configured to transport holes.

3. The optoelectronic device according to claim 1, wherein
   the quantum dots of the electron transport layer, the active layer, and the hole transport layer are colloidal quantum dots.

4. The optoelectronic device according to claim 1, wherein
   the quantum dots of the electron transport layer, the active layer, and the hole transport layer comprise the same material.

5. The optoelectronic device according to claim 1, wherein
   the quantum dots of the electron transport layer, the active layer, and the hole transport layer differ in size, wherein
   the size of the quantum dots of the active layer is larger than that of the electron transport layer and of the hole transport layer, and/or
   the size of the quantum dots of the electron transport layer is larger than that of the hole transport layer.

6. The optoelectronic device according to claim 1, wherein
   the size of the quantum dots of at least one the electron transport layer, the active layer, and the hole transport layer is configured such that said quantum dots have a light absorption and/or emission spectrum with a predetermined maximum.

7. The optoelectronic device according to claim 1, wherein
   the electron transport layer comprises two layers of quantum dots, and/or
   the active layer comprises two layers of quantum dots, and/or
   the hole transport layer comprises four layers of quantum dots.

8. The optoelectronic device according to claim 1, wherein
   the surface attached ligands of the quantum dots of the electron transport layer are configured to extract holes from the quantum dots of the electron transport layer and/or, the surface attached ligands of the quantum dots of the hole transport layer are configured to extract electrons from the quantum dots of the hole transport layer.

9. The optoelectronic device according to claim 1, wherein
the surface attached ligands of the quantum dots of the electron transport layer comprise inorganic cations and/or the surface attached ligands of the quantum dots of the hole transport layer comprise thiols.

10. The optoelectronic device according to claim 1, wherein
the surface attached ligands of the quantum dots of the hole transport layer comprise mercaptopropionic acid (MPA).

11. The optoelectronic device according to claim 1, wherein
the surface attached ligands of the quantum dots of the active layer comprise mercaptooctanoic acid (MOA).

12. The optoelectronic device according to claim 1, wherein
the surface attached ligands of the quantum dots of the electron transport layer comprise tetrabutylammonium iodide (TBAI).

13. The optoelectronic device according to claim 1, wherein
each of the quantum dots of the electron transport layer, the active layer, and the hole transport layer comprises a thiol-based surface attached ligand.

14. The optoelectronic device according to claim 1, wherein
the quantum dots of the electron transport layer and the hole transport layer each has an absorption maximum of ≤785 nm, and quantum dots of the active layer each has an absorption maximum of >1200 nm.

15. Method of fabricating an optoelectronic device, comprising the steps of:
providing a hole transport layer,
providing an active layer, and
providing an electron transport layer, wherein
each of the steps of providing the hole transport layer, the active layer, and the electron transport layer comprises providing at least one layer of quantum dots,
the quantum dots of at least one of the electron transport layer, the active layer, and the hole transport layer comprise surface attached ligands,
the quantum dots of at least one of the electron transport layer and the hole transport layer are doped by the surface attached ligands, and
when the quantum dots of the active layer comprise surface attached ligands, the ligands are configured to separate the quantum dots of the active layer.

16. Method according to claim 15, wherein
before the steps of providing the hole transport layer, the active layer, and the electron transport layer, the method further comprises:
providing lead (II) sulfide (PbS) as a predetermined material, and preparing the quantum dots of the electron transport layer, the active layer, and the hole transport layer of said material.

17. Method according to claim 15, wherein
the quantum dots of the electron transport layer, the active layer, and the hole transport layer are prepared by wet chemical synthetic methods or physical or chemical vapor deposition methods.

18. Method according to claim 15, wherein
the size of the quantum dots of the electron transport layer, the active layer, and the hole transport layer is controlled by the growth time of the quantum dots.

19. Method according to claim 15, wherein
the quantum dots of the hole transport layer and/or the electron transport layer are synthesized using a hot injection method.

20. Method according to claim 15, wherein
the quantum dots of the active layer are synthesized using lead (II) oleate as precursor.

* * * * *